(12) United States Patent
Kuo et al.

(10) Patent No.: US 9,747,404 B2
(45) Date of Patent: Aug. 29, 2017

(54) METHOD FOR OPTIMIZING AN INTEGRATED CIRCUIT LAYOUT DESIGN

(71) Applicant: UNITED MICROELECTRONICS CORP., Hsin-Chu (TW)

(72) Inventors: Shih-Ming Kuo, Tainan (TW); Ming-Jui Chen, Hsinchu (TW); Te-Hsien Hsieh, Kaohsiung (TW); Ping-I Hsieh, Tainan (TW); Jing-Yi Lee, Tainan (TW); Yan-Chun Chen, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 161 days.

(21) Appl. No.: 14/807,869

(22) Filed: Jul. 23, 2015

(65) Prior Publication Data

US 2017/0024506 A1    Jan. 26, 2017

(51) Int. Cl.
*G06F 17/50*     (2006.01)
*G03F 1/36*      (2012.01)

(52) U.S. Cl.
CPC ............ *G06F 17/5072* (2013.01); *G03F 1/36* (2013.01); *G06F 17/5081* (2013.01)

(58) Field of Classification Search
CPC ........ G03F 1/36; G03F 7/705; G03F 7/70525; G06F 17/5068; G06F 17/5081
USPC ...................... 716/52–53, 55, 110
See application file for complete search history.

(56) References Cited

U.S. PATENT DOCUMENTS

| | | | |
|---|---|---|---|
| 6,536,023 B1 | 3/2003 | Mohan | |
| 6,804,808 B2 | 10/2004 | Li | |
| 7,127,694 B2 | 10/2006 | Watanabe | |
| 7,886,248 B2 | 2/2011 | Hirota | |
| 7,930,667 B2 | 4/2011 | Bergman Reuter | |
| 8,386,970 B2 | 2/2013 | Ueda | |
| 2004/0064796 A1* | 4/2004 | Li | G06F 17/5081 716/112 |
| 2005/0166176 A1* | 7/2005 | Watanabe | G03F 1/36 430/5 |
| 2008/0244499 A1* | 10/2008 | Hanamitsu | G06F 17/5077 716/137 |
| 2009/0039520 A1* | 2/2009 | Tanaka | G06F 17/5077 257/773 |
| 2010/0295153 A1* | 11/2010 | Chu | H01L 23/5223 257/532 |
| 2013/0292841 A1* | 11/2013 | Lai | H01L 23/5226 257/774 |
| 2015/0213185 A1* | 7/2015 | Hensel | G06F 17/5081 716/112 |

* cited by examiner

*Primary Examiner* — Paul Dinh
(74) *Attorney, Agent, or Firm* — Winston Hsu

(57) ABSTRACT

A method for optimizing an integrated circuit layout design includes the following steps. A first integrated circuit layout design including a metal line feature having several metal lines and a second integrated circuit layout design including a hole feature having several holes are obtained. A line-end hole feature of the hole feature is selected by piecing the metal line feature with the hole feature. The line-end hole feature is classified into a single hole feature and a redundant hole feature by spacings between the adjacent holes by a computer system.

15 Claims, 3 Drawing Sheets

METHOD FOR OPTIMIZING AN INTEGRATED CIRCUIT LAYOUT DESIGN

BACKGROUND OF THE INVENTION

1. Field of the Invention

The present invention relates generally to a method for optimizing an integrated circuit layout design, and more specifically to a method for optimizing an integrated circuit layout design by separating single holes and redundant holes of line-end holes.

2. Description of the Prior Art

An integrated circuit (IC) is a device, such as a semiconductor device, or an electronic system that includes many electronic components, such as transistors, resistors and diodes. These components are often interconnected to form multiple circuit components, e.g. gates, cells, memory units, arithmetic units, controllers and decoders. An IC includes multiple layers of wiring that interconnects the electronic and circuit components. Design engineers design ICs by transforming logical or circuit descriptions of the components into geometric descriptions, which are called design layouts.

Fabrication foundries (fabs) manufacture ICs based on the design layouts using a photolithographic process. Photolithography is an optical printing and fabrication process by which patterns on a photolithographic mask (i.e. a photomask) are imaged and defined onto a photosensitive layer coating a substrate. To fabricate an IC, photomasks are created using the IC design layout as a template. The photomasks contain the various geometries (features) of the IC design layout. The various geometries contained on the photomasks correspond to the various base physical IC elements that comprise functional circuit components such as transistors, interconnect wiring and via pads, as well as other elements that are not functional circuit elements, but are used to facilitate, enhance or track various manufacturing processes. Through sequential use of the various photomasks corresponding to a given IC in an IC fabrication process, a large number of material layers of various shapes and thicknesses with different conductive and insulating properties may be built up to form the overall IC and the circuits within the IC design layout.

SUMMARY OF THE INVENTION

The present invention provides a method for optimizing an integrated circuit layout design, which selects a line-end hole feature from a hole feature, and then classifies the line-end hole feature into a single hole feature and a redundant hole feature by spacings between adjacent holes, so that the single hole feature can be repaired or treated while the redundant hole feature is omitted.

The present invention provides a method for optimizing an integrated circuit layout design including the following steps. A first integrated circuit layout design including a metal line feature having several metal lines and a second integrated circuit layout design including a hole feature having several holes are obtained. A line-end hole feature of the hole feature is selected by piecing the metal line feature with the hole feature. The line-end hole feature is classified into a single hole feature and a redundant hole feature by spacings between the adjacent holes by a computer system.

According to the above, the present invention provides a method for optimizing an integrated circuit layout design, which obtains a first integrated circuit layout design including a metal line feature and a second integrated circuit layout design including a hole feature, selects a line-end hole feature from the hole feature by piecing the metal line feature with the hole feature, and then classifies the line-end hole feature into a single hole feature and a redundant hole feature by spacings between adjacent holes. By doing this, the single hole feature and the redundant hole feature can be classified from the hole feature printed in one single layer of a wafer, without any layout design information in other layers such as an upper layer or a lower layer of the wafer. Moreover, the single hole feature can be repaired or treated individually with the redundant hole feature being neglected. Hence, the invention reduces treatment such as repair or review rates, and saves mask tape out time and design costs.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
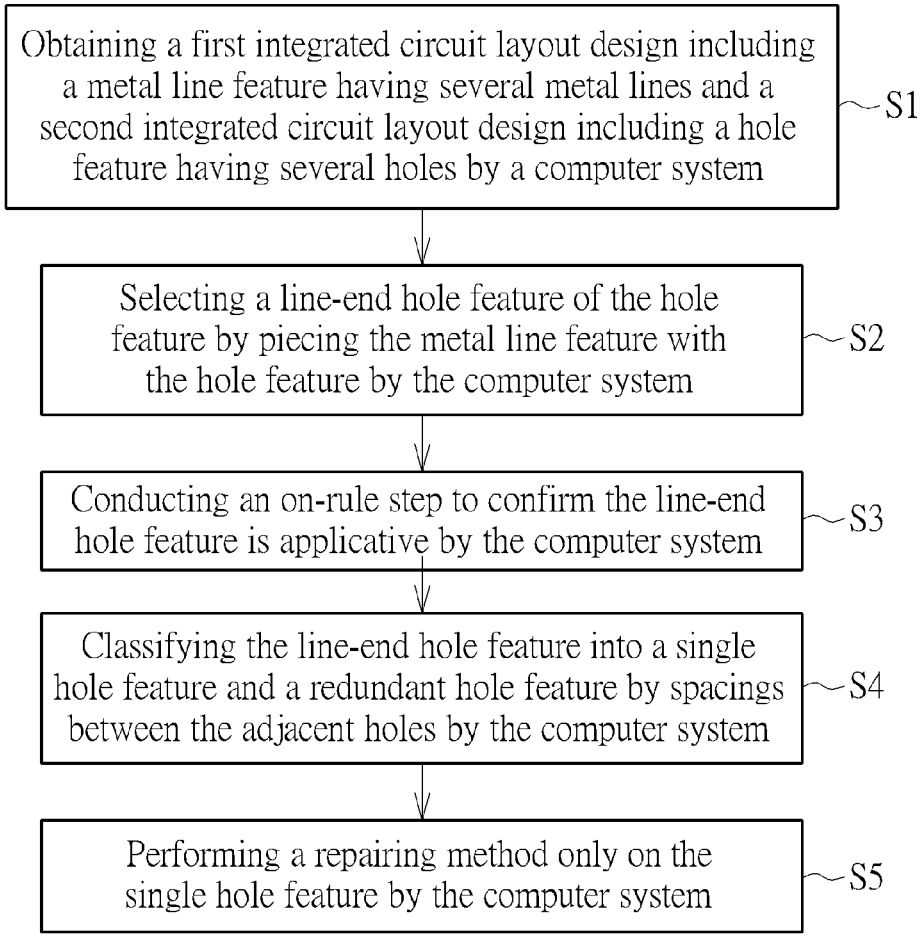
FIG. 1 schematically depicts a flow chart of a method for optimizing an integrated circuit layout design according to an embodiment of the present invention.
Figure 2:
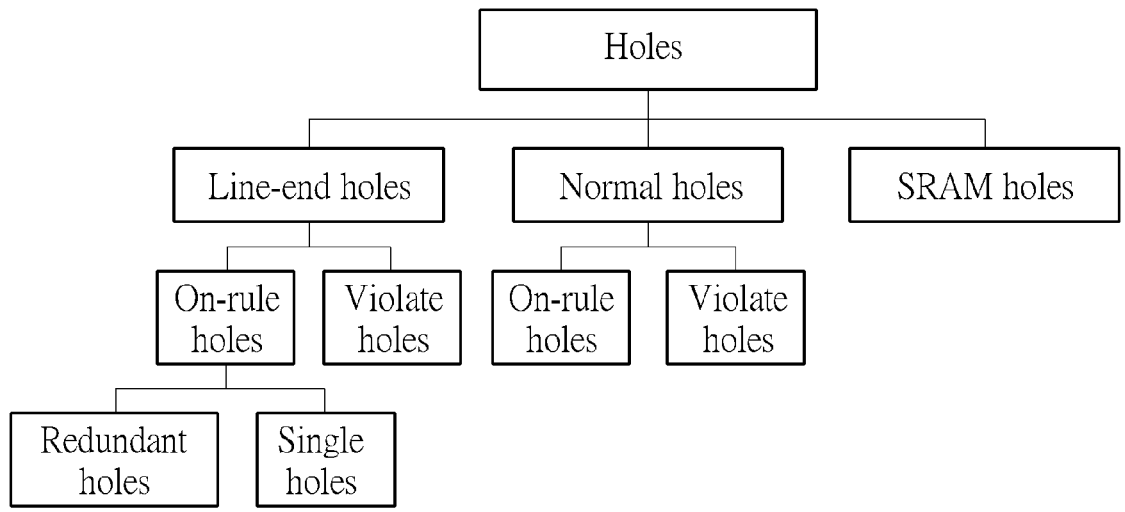
FIG. 2 schematically depicts a classifying chart of holes of an integrated circuit layout design of FIG. 1.

FIG. 1 schematically depicts a flow chart of a method for optimizing an integrated circuit layout design according to an embodiment of the present invention. FIG. 2 schematically depicts a classifying chart of holes of an integrated circuit layout design of FIG. 1. FIGS. 3-6 schematically depict top views of a method for optimizing an integrated circuit layout design according to an embodiment of the present invention. Please refer to the flow chart of FIG. 1 accompanied with its corresponding classifying holes chart of FIG. 2, paired with top views of FIGS. 3-6. FIG. 2 is just one case of classifying holes applying the method for optimizing an integrated circuit layout design of the present invention as described in FIG. 1. FIGS. 3-6 show just one embodiment of integrated circuit layouts applying the method for optimizing an integrated circuit layout design of the present invention as described in FIG. 1. FIGS. 3-6 depict layouts being geometric patterns simulating patterns formed on a wafer by exposing and etching. In this embodiment, holes in FIGS. 3-6 are rectangles according to patterns in original database of integrated circuit layouts, but the holes in FIGS. 3-6 can also be circles or ellipses according to simulating patterns formed on a wafer. The method for optimizing an integrated circuit layout design as described in FIG. 1 can be applied in many other integrated circuit layout design cases, including metal lines and holes.

Figure 3:
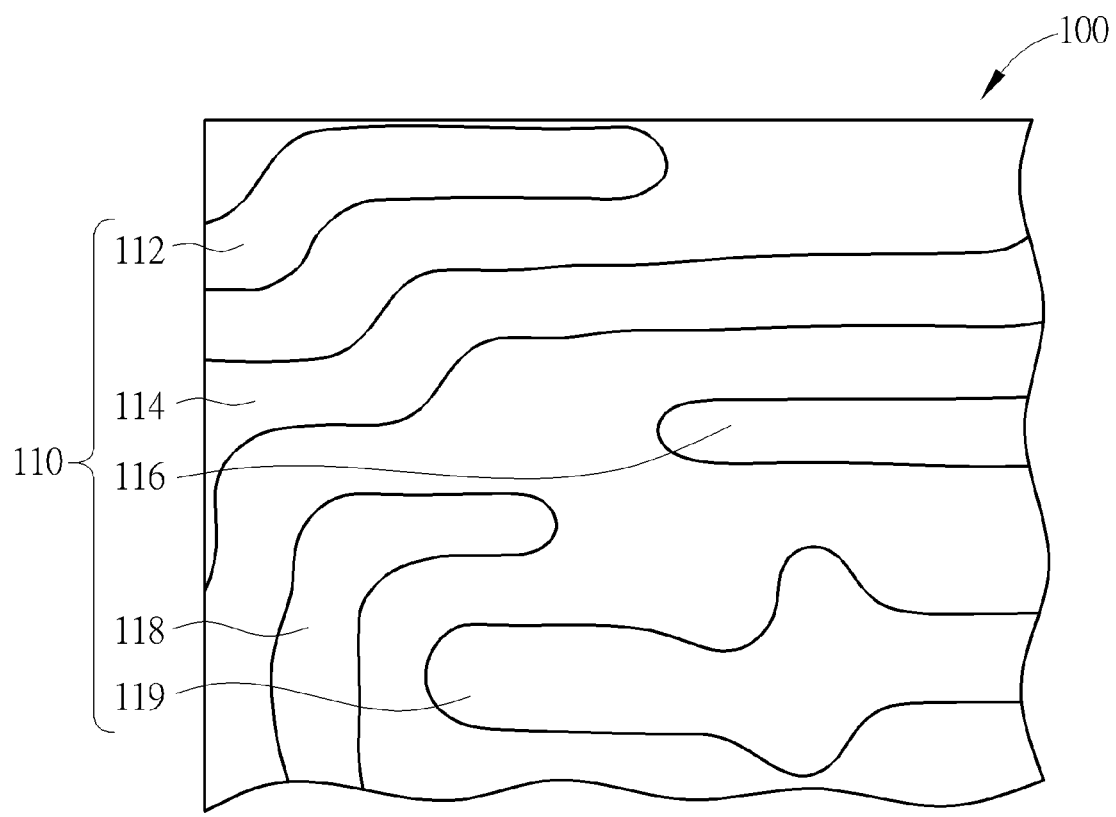
FIGS. 3-6 schematically depict top views of a method for optimizing an integrated circuit layout design according to an embodiment of the present invention.
Figure 4:
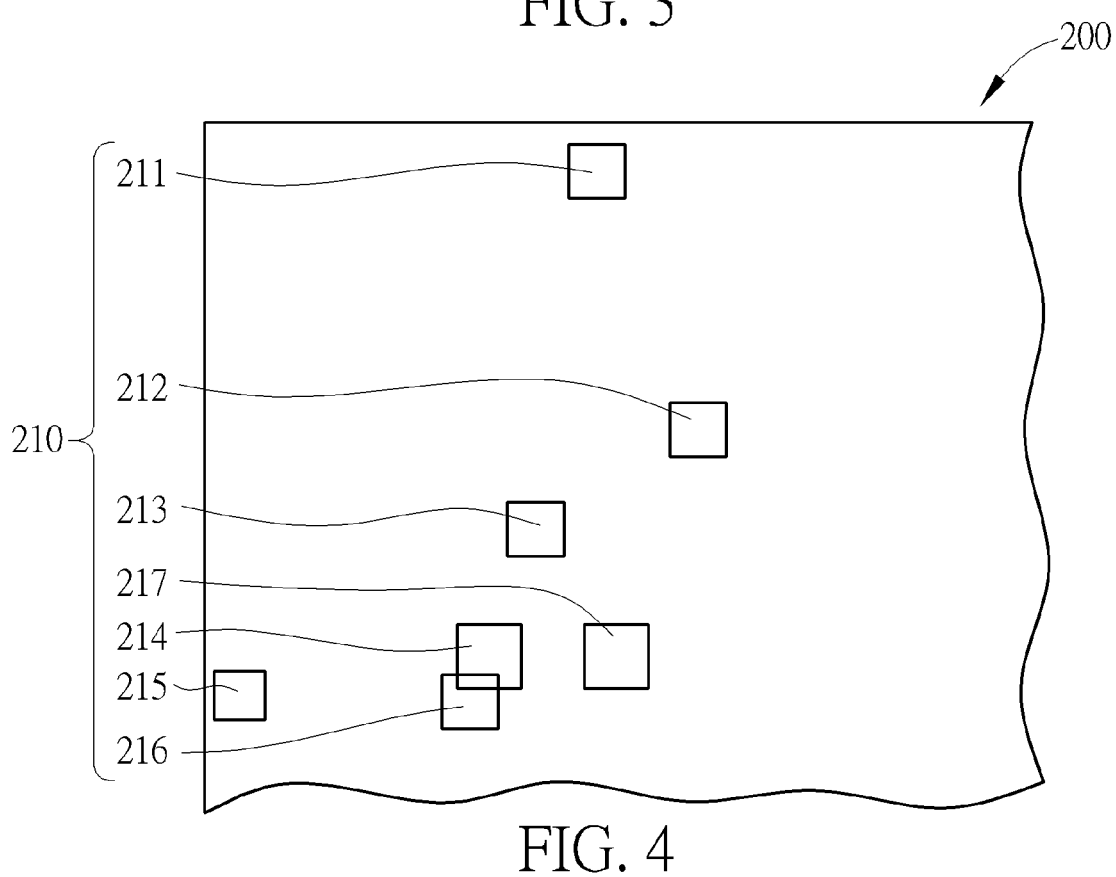

According to Step S1 of FIG. 1—obtaining a first integrated circuit layout design including a metal line feature having several metal lines and a second integrated circuit layout design including a hole feature having several holes by a computer system, please refer to FIG. 3 and FIG. 4, accompanied with FIG. 2. A first integrated circuit layout design 100 is obtained. The first integrated circuit layout 100 includes a metal line feature 110. The metal line feature 110 has several metal lines 112/114/116/118/119. A second integrated circuit layout design 200 is obtained. The second integrated circuit layout design 200 includes a hole feature 210. The hole feature 210 has several holes 211/212/213/214/215/216/217. In this case, the holes 211/212/213/214/215/216/217 are printed in the metal lines 112/114/116/118/119 printed in a wafer (not shown), such that the holes 211/212/213/214/215/216/217 may be contact holes while the metal lines 112/114/116/118/119 may be interconnect structures; thus, the metal line feature 110 and the hole feature 210 are printed in adjacent layers of the wafer.

Figure 5:
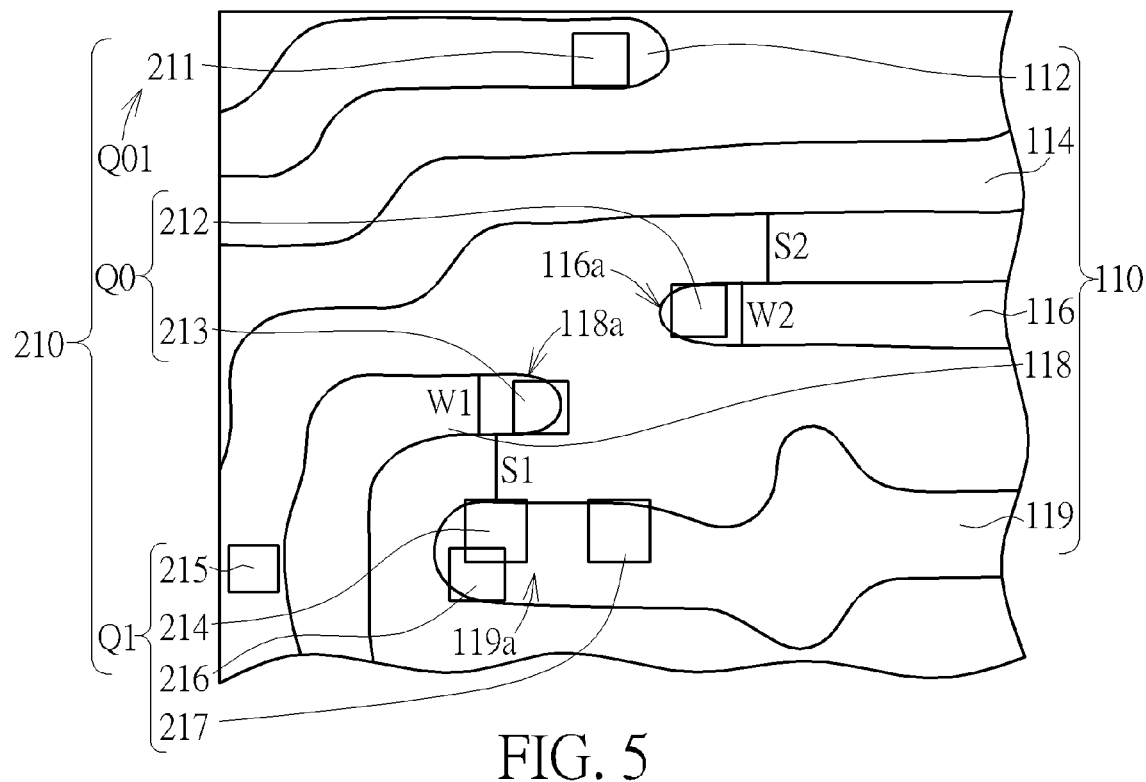

According to Step S2 of FIG. 1—selecting a line-end hole feature of the hole feature by piecing the metal line feature with the hole feature by the computer system, please refer to FIG. 5, accompanied with FIG. 2. Integrating the first integrated circuit layout design 100 with the second integrated circuit layout design 200 to piece the metal line feature 110 with the hole feature 210. As a result, some of the holes 211/212/213/214/216/217 may at least partially overlap the metal lines 112/116/118/119 while the other hole 215 may not overlap any of the metal lines 112/114/116/118/119. More precisely, the whole hole 211 overlaps the metal line 112; the holes 212/213/214/216/217 partially overlap the metal lines 116/118/119 with different coverage ranges; the hole 215 does not overlap any of the metal lines 112/114/116/118/119.

A line-end hole feature Q0 of the hole feature 210 is selected. This means the holes 212/213 respectively overlapping ends 116a/118a of the metal lines 116/118 are selected to constitute the line-end hole feature Q0. In this case, the line-end hole feature Q0 only includes the holes 116/118 overlapping the ends 116a/118a of the metal lines 116/118, where line-widths become thinner In one case, a line-end has a line-width less than 1.5~2.0 times of a minimum line-width, and a distance from the end of the line less than 1.1~1.5 times of the minimum line-width. As holes fall in the line-end are line-end holes. For example, for a 55 nanometers process with a minimum line-width of 90 nanometers, as holes are in the line-width being less than 168 nanometers, which is 1.87 times of the minimum line-width, and are at the distance from the end of the line being less than 99 nanometers, which is 1.1 times of the minimum line-width, the holes are line-end holes, but it is not limited thereto, depending upon layout's characteristic or process demands. The holes 214/216 are not included in the line-end hole feature Q0 because of their corresponding metal line 119 does not having a line-width becoming thinner in the end 119a. However, in other cases, the line-end hole feature Q0 may include all of the holes 212/213/214/216 actually overlapping the ends 116a/118a/119a of the metal lines 116/118/119. The rule of selecting the line-end hole feature Q0 depends upon practical requirements.

Moreover, the hole feature 210 may also include a normal hole feature and a static random access memory (SRAM) hole feature, according to FIG. 2. Please refer to FIG. 5, the normal hole feature Q1 may include the holes 211/214/215/216/217, which do not overlap the ends 116a/118a of the metal lines 116/118, and the static random access memory (SRAM) hole feature is not depicted as it is in another area. Since the line-end hole feature Q0 has a tighter tolerance than that of the normal holes feature Q1, the method of the present invention particularly selects the line-end hole feature Q0 to analyze its defects. In one case, the tolerance of the line-end hole feature Q0 may approach 99% coverage ranges of holes overlapping their corresponding metal lines, while the tolerance of the normal holes feature Q1 may approach 80% coverage ranges of holes overlapping their corresponding metal lines, but it is not limited thereto, the tolerance of coverage ranges depends upon practical requirements.

According to Step S3 of FIG. 1—conducting an on-rule step to confirm the line-end hole feature is applicative by the computer system, please refer to FIG. 5, accompanied with FIG. 2. In this embodiment, an on-rule step is conducted right after the step S2 of selecting the line-end hole feature Q0 is carried out. The on-rule step may include many rules for confirming the holes 212/213 of the line-end hole feature Q0 being applicative. The on-rule step may include confirming the holes 212/213 of the line-end hole feature Q0 being in the metal lines 116/118, or/and confirming minimum widths w1/w2 and minimum spacings s1/s2 of the metal lines 116/118 being applicative, but it is not limited thereto. A minimum width w1/w2 is equal to a line-width of a line-end, meaning the line-width less than 1.5~2.0 times of a minimum line-width. For instance, for a 40 nanometers process with a minimum line-width of 63 nanometers, the minimum width w1/w2 may fall into a range of 63~126 nanometers, while the minimum spacing s1/s2 may be larger than 63 nanometers, but it is not limited thereto. As the holes 212/213 are applicative, the holes 212/213 are on-rule holes; in contrast, the holes are violate holes and cannot be used.

In this embodiment, the on-rule step is conducted not only to confirm the holes 212/213 of the line-end hole feature Q0, but also to confirm the holes 211/214/215/216/217 of the normal holes feature Q1 according to FIG. 2, but with different tolerance said previously; that is, the line-end hole feature Q0 has a tighter tolerance than that of the normal hole feature Q1. Thus, the holes 211/214/216/217 are on-rule holes while the hole 215 is a violate hole and cannot be used because of the whole hole 215 being outside the metal line 118.

Figure 6:
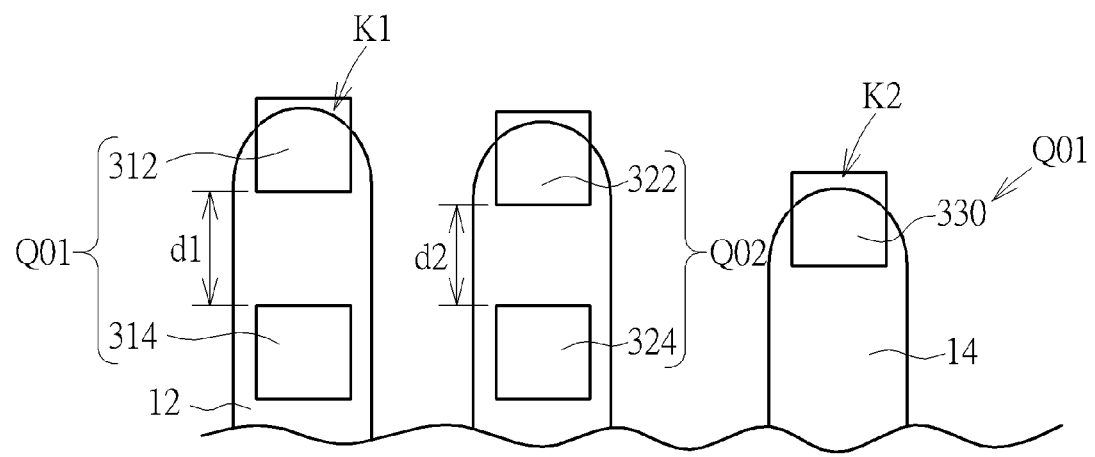

According to Step S4 of FIG. 1—classifying the line-end hole feature into a single hole feature and a redundant hole feature by spacings between the adjacent holes by the computer system, please refer to FIG. 6, accompanied with FIG. 2. For clarifying the method of the present invention, FIG. 6 depicts three cases of hole distributions that may occur while classifying the line-end hole feature. The rule of classifying the line-end hole feature into a single hole feature and a redundant hole feature may include depending on whether spacings d1/d2 between the adjacent holes 312/314, 322/324 exceed or fall into a minimum dense hole space tolerance, but it is not limited thereto. That is, the minimum dense hole space tolerance may be a value depending upon device performance requirements or design demands. Preferably, the minimum dense hole space tolerance is a predetermined minimum dense hole space +/−10%, for example 90 nm+/−10%. Still preferably, the minimum dense hole space tolerance is a predetermined minimum dense hole space, but it is not limited thereto. As the spacing d1 between the adjacent holes 312/314 exceeds a minimum dense hole space tolerance, the adjacent holes 312/314 are single holes and thus are classified into a single hole feature Q01, and as the spacing d2 between the adjacent holes 322/324 falls in the minimum dense hole space tolerance, one of the adjacent holes 322/324 is a redundant hole and thus are classified into a redundant hole feature Q02. Furthermore, a hole 330 is a single hole and is classified into the single hole feature because of no any other hole being adjacent to the hole 330; this is the case just like the holes 212/213 of FIG. 5. It is emphasized that, the single hole feature Q01 and the redundant hole feature Q02 can be classified from the line-end hole feature Q0 (by the spacings d1/d2 between adjacent holes 312/314, 322/324) in the hole feature Q0 printed in one single layer of a wafer (not shown), without any layout design information in other layers such as an upper layer or a lower layer of the wafer according to this method of the present invention.

According to Step S5 of FIG. 1—performing a repairing method only on the single hole feature by the computer system, please refer to FIG. 6, accompanied with FIG. 2. After the Step S4 of classifying the line-end hole feature Q0 into the single hole feature Q01 and the redundant hole feature Q02, a repairing method may be performed only on the single hole feature Q01, with the redundant hole feature Q02 being omitted. The repairing method may include identifying defects K1/K2 of the single hole feature Q01 and then repairing the defects K1/K2. Due to the holes 312/330 exceeding their corresponding metal lines 12/14 more than a tolerance said previously, the holes 312/330 and the metal lines 12/14 should be repaired. The repairing method may be an optical proximity correction (OPC) treatment process or an enclosure check process, but it is not limited thereto. Accordingly, the single hole feature Q01 can be repaired by methods such as a repairing method individually as the redundant hole Q02 is neglected. Thereby, reducing repair or review rates, and saving mask tape out time and design costs.

Thereafter, resultant layout designs of the first integrated circuit layout design 100 and the second integrated circuit layout design 200 can be output to form patterns of photomasks for printed on a wafer.

To summarize, the present invention provides a method for optimizing an integrated circuit layout design, which obtains a first integrated circuit layout design including a metal line feature and a second integrated circuit layout design including a hole feature, selects a line-end hole feature from the hole feature by piecing the metal line feature with the hole feature, and then classifies the line-end hole feature into a single hole feature and a redundant hole feature by spacings between adjacent holes. That is, as the spacings between the adjacent holes exceed a minimum dense hole space tolerance, the adjacent holes are classified into the single hole feature, and as the spacings between the adjacent holes fall in the minimum dense hole space tolerance, the adjacent holes are classified into the redundant hole feature. In this way, the single hole feature and the redundant hole feature can be recognized from the hole feature printed in one single layer of a wafer, without any layout design information in other layers such as an upper layer or a lower layer of the wafer. Moreover, the single hole feature can be repaired or treated by methods such as a repairing method individually as the redundant hole is neglected. Hence, the invention reduces treatment such as repair or review rates, and saves mask tape out time and design costs.

Furthermore, the repairing method may be an optical proximity correction (OPC) treatment process, an enclosure check process or others. An on-rule step may be optionally conducted to confirm the line-end hole feature is applicative. The on-rule step is preferably conducted after the line-end hole feature is selected, but it is not limited thereto. The on-rule step may include confirming the holes of the line-end hole feature being in the metal lines, confirming minimum widths and minimum spacings of the metal lines being applicative.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for optimizing an integrated circuit layout design, comprising:
   obtaining a first integrated circuit layout design comprising a metal line feature having several metal lines and a second integrated circuit layout design comprising a hole feature having several holes by a computer system, wherein the metal line feature and the hole feature are printed in adjacent layers of a wafer;
   selecting a line-end hole feature of the hole feature by piecing the metal line feature with the hole feature by the computer system; and
   classifying the line-end hole feature into a single hole feature and a redundant hole feature depending on whether spacings between adjacent holes of the line-end hole feature exceeding or falling into a minimum dense hole space tolerance by the computer system.

2. The method for optimizing an integrated circuit layout design according to claim 1, wherein the step of selecting the line-end hole feature of the hole feature comprises:
   piecing the metal line feature with the hole feature; and
   recognizing the line-end hole feature by selecting the holes in ends of the metal lines, where line-widths become thinner.

3. The method for optimizing an integrated circuit layout design according to claim 1, wherein the step of classifying the line-end hole feature into the single hole feature and the redundant hole feature comprises:
   as the spacings between the adjacent holes exceed a minimum dense hole space tolerance, the adjacent holes classified into the single hole feature, and as the spacings between the adjacent holes fall in the minimum dense hole space tolerance, the adjacent holes classified into the redundant hole feature.

4. The method for optimizing an integrated circuit layout design according to claim 3, wherein the minimum dense hole space tolerance comprises a predetermined minimum dense hole space tolerance +/−10%.

5. The method for optimizing an integrated circuit layout design according to claim 4, wherein the minimum dense hole space tolerance comprises a predetermined minimum dense hole space.

6. The method for optimizing an integrated circuit layout design according to claim 1, further comprising:
   repairing only the single hole feature by the computer system after classifying the line-end hole feature.

7. The method for optimizing an integrated circuit layout design according to claim 6, wherein the repairing method comprises identifying defects of the single hole feature and then repairing the defects.

8. The method for optimizing an integrated circuit layout design according to claim 6, wherein the repairing method comprises an optical proximity correction (OPC) treatment process.

9. The method for optimizing an integrated circuit layout design according to claim 6, wherein the repairing method comprises an enclosure check process.

10. The method for optimizing an integrated circuit layout design according to claim 1, further comprising:
    conducting an on-rule step to confirm the line-end hole feature is applicative by the computer system.

11. The method for optimizing an integrated circuit layout design according to claim 10, wherein the on-rule step is conducted after selecting the line-end hole feature.

12. The method for optimizing an integrated circuit layout design according to claim 10, wherein the on-rule step comprises confirming the holes of the line-end hole feature are in the metal lines.

13. The method for optimizing an integrated circuit layout design according to claim 10, wherein the on-rule step comprises confirming minimum widths and minimum spacings of the metal lines are applicative.

14. The method for optimizing an integrated circuit layout design according to claim 1, wherein the hole feature comprises the line-end hole feature and a normal hole feature.

15. The method for optimizing an integrated circuit layout design according to claim 14, wherein the hole feature comprises a static random access memory (SRAM) hole feature.

* * * * *